United States Patent [19]

Otsuki et al.

[11] 4,417,163

[45] Nov. 22, 1983

[54] BUFFER CIRCUITS

[75] Inventors: Yoshio Otsuki; Masaru Uesugi, both of Tokyo; Nobuaki Ieda, Kodaira, all of Japan

[73] Assignees: Oki Electric Industry Co., Ltd.; Nippon Telegraph and Telephone Public Corporation, both of Tokyo, Japan

[21] Appl. No.: 235,035

[22] Filed: Feb. 17, 1981

[30] Foreign Application Priority Data

Feb. 20, 1980 [JP] Japan .................................. 55-19042

[51] Int. Cl.³ ................. H03K 19/092; H03K 17/693; G11C 8/00
[52] U.S. Cl. .................................... 307/475; 307/356; 307/482; 307/578; 365/203; 365/230
[58] Field of Search ................. 307/475, DIG. 1, 452, 307/463, 482, 356, 575, 578; 365/203, 205, 230

[56] References Cited

U.S. PATENT DOCUMENTS

| 4,077,031 | 2/1978 | Kitagawa et al. | 365/203 X |
| 4,110,639 | 8/1978 | Redwine | 365/230 X |
| 4,291,246 | 9/1981 | Martino, Jr. et al. | 365/230 X |

OTHER PUBLICATIONS

Paul R. Schroeder and Robert J. Proebsting "A 16K×1 Bit Dynamic RAM", pub. —Digest of Technical Papers of the 1977 IEEE International Solid—State Circuits Conference, pp. 12 and 13.

Primary Examiner—Larry N. Anagnos
Assistant Examiner—David R. Hudspeth
Attorney, Agent, or Firm—Wenderoth, Lind & Ponack

[57] ABSTRACT

The buffer circuit is provided with a high sensitivity balanced type flip-flop circuit and a capacative coupling provided by MOS capacitance, and a load drive circuit utilizes bootstrap effect, thus producing complementary signals having a MOS level from a TTL address input signal.

8 Claims, 9 Drawing Figures

FIG_2(a)
PRIOR ART

FIG_2(b)
PRIOR ART

FIG_3(a)

FIG_4(a)

FIG_4(b)

BUFFER CIRCUITS

BACKGROUND OF THE INVENTION

This invention relates to a buffer circuit, and more particularly to an address buffer circuit utilized for an MOS type dynamic RAM used for converting a signal at a bipolar logic level (transistor to transistor logic (TTL) level) into complementary signals at an MOS logic level.

Figure 1A:
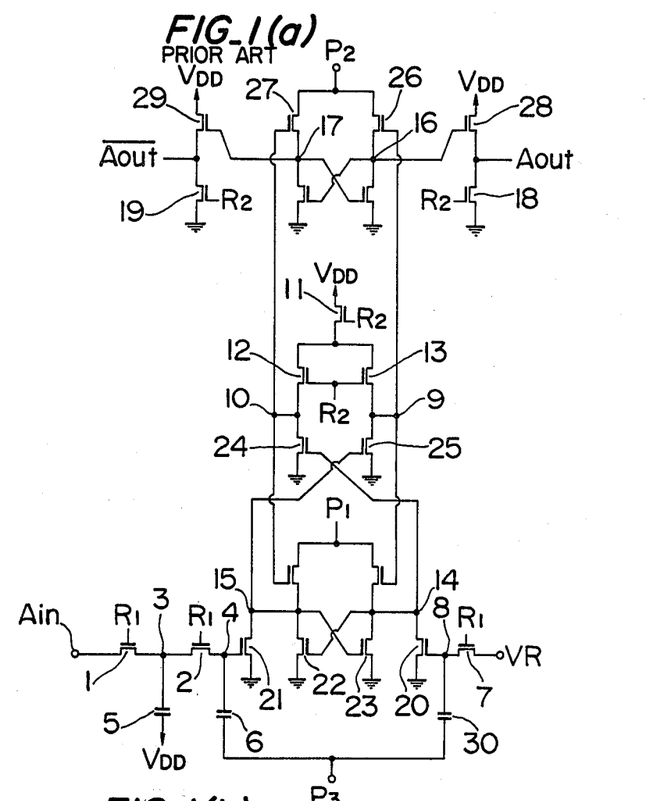
FIG. 1a is a circuit diagram showing a perior art address buffer circuit.

FIG. 1a is a circuit diagram showing a prior art address buffer circuit which compares a reference potential with a TTL address input signal and converts the difference into complementary address signals at MOS levels.

In FIG. 1a, transistors 22 and 23 constitute a flip-flop circuit, and to a terminal VR is impressed a reference potential (an average value (about 1.5 V) of a permissible minimum value 2.2 V in a high (H) level region of a TTL input signal and a permissible maximum value in a low (L) level region). A high level TTL input signal is applied to an input terminal Ain which is adapted to receive an address input signal.

Figure 1B:
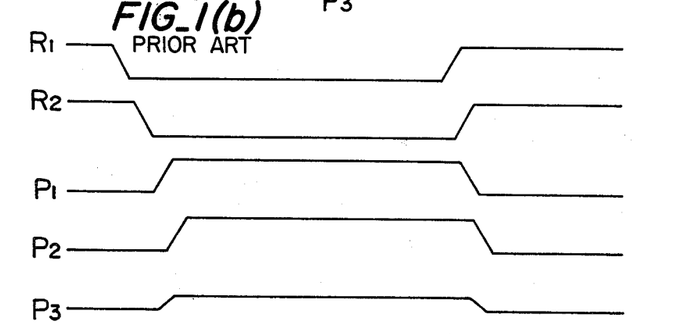

At first, it is assumed that the timing signals $R_1$, $R_2$, $P_1$, $P_2$ and $P_3$ shown in FIG. 1b have levels H, H, L, L and L respectively. Then, transistors 1, 2 and 7 shown in FIG. 1a are turned ON so that capacitors 5 and 6 are charged to the level of the address input signal, while a capacitor 30 is charged to the reference potential. As a consequence thereof, transistor 20 and 21 are turned ON.

Transistors 11, 12, 13, 18 and 19 are also turned ON so that both output terminals Aout and $\overline{\text{Aout}}$ assume a ground potential, while nodes 9 and 10 are precharged to a potential of ($V_{DD}$-$V_{Ta}$) where $V_{DD}$ represents the source voltage of the MOS circuit, and $V_{Ta}$ represents the threshold values of transistors 11, 12 and 13.

Then, when the timing signals $R_1$ and $R_2$ change from an H level to an L level, and when the timing signals $P_1$, $P_2$ and $P_3$ successively become an H level, a flip-flop circuit constituted by transistors 22 and 23 is latched such that the potential of a node 14 becomes ($V_{DD}-V_{Tb}$), whereas the potential of a node 15 becomes a ground potential, i.e., a low level due to the difference in the gate voltages of transistors 22 and 23, wherein $V_{Tb}$ represents the threshold value of transistor 16.

Accordingly, transistors 25 and 26 respectively become nonconductive and conductive so that a node 9 maintains the potential ($V_{DD}-V_T$) at the time of precharging, while a node 10 is at an L level or at a ground potential.

Since transistors 26 and 27 respectively become conductive and nonconductive, nodes 16 and 17 are respectively at an H level and at an L level. Consequently, transistor 28 is turned ON so that a signal at substantially an H level of the MOS voltage $V_{Db}$ appears at the output Aout. On the other hand, transistor 29 becomes nonconductive so as to produce a signal at an L level.

The address buffer circuit shown in FIG. 1a, however, has the following defects. Since it is necessary to use capacitor 5 for the purpose of preventing the misoperation of the transistor 21 due to an undershoot or overshoot of the address input signal, the time constant of the signal input unit becomes large, thus lengthening an address set up time.

Furthermore, when a TTL H level signal having the permissible minimum potential is applied, since the sensitivity of the flip-flop circuit becomes lower, the potentials of nodes 4 and 8 also become lower, thereby causing the misoperation of the flip-flop circuit. To prevent this difficulty, it is necessary to use capacitors 6 and 30 for compensating for the lowering of the node potentials by the timing signal $P_3$.

Generally, it is difficult to set the compensating potential at an optimum value. Thus, where the compensation level of the nodes 4 and 8 is made too high, the time required for the timing signal $P_1$ to latch the flip-flop circuit is lengthened and the currents flowing through transistors 16 and 20 are increased, thereby increasing the power consumption of the circuit.

Furthermore, the output terminals Aout and $\overline{\text{Aout}}$, rather than outputting low level signals, float because of the fact that the gate electrodes of transistors 19 and 29 are at a low level, thus failing to positively produce low level outputs.

Figure 2A:
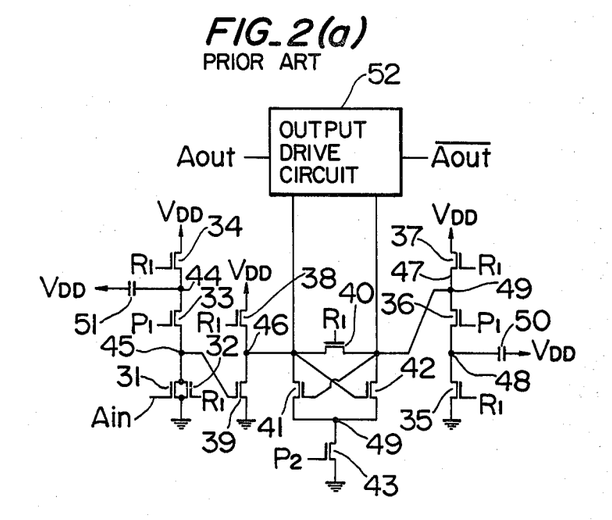
FIG. 2a is a circuit diagram showing another prior art address buffer circuit.

FIG. 2a shows another prior art address buffer circuit not using an exclusive reference source potential. In explaining the operation of the buffer circuit shown in FIG. 2a, it is assumed that a low level TTL input signal is applied to the address signal input Ain.

Figure 2B:
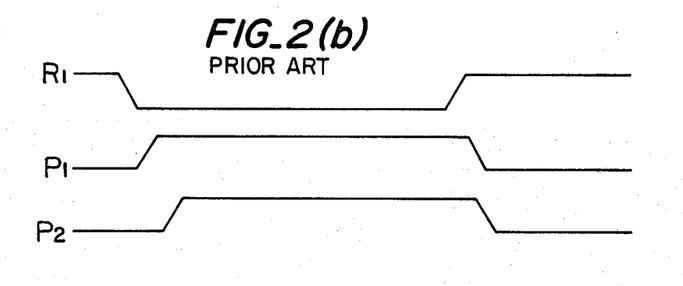

When timing signals $R_1$, $P_1$ and $P_2$ shown in FIG. 2b have H, L and L levels respectively, transistors 32, 34, 35, 37, 38 and 40 become conductive with the result that nodes 45 and 48 assume a ground potential, whereas nodes 49, 44, 46 and 47 have potentials which are substantially equal to the source potential $V_{DD}$.

Then, when timing signals $R_1$, $P_1$ and $P_2$ become sequentially L, H and H levels, transistors 33 and 36 are rendered conductive while transistor 39 becomes conductive so that the potential of the node 47 becomes equal to a potential produced by dividing the source potential $V_{DD}$ with a capacitor 50 and the parasitic capacitance of a node 47. The gate electrode of transistor 39 is supplied with a potential obtained by dividing the source potential $V_{DD}$ with a capacitor 51 and a parasitic capacitance between the gate electrode of transistor 39 and ground. As a consequence thereof, transistor 39 becomes conductive so that the potential of the node 46 becomes equal to the ground potential and the logic levels of these nodes 46, 47 are transmitted to an output drive circuit 52.

However, in the address buffer circuit shown in FIG. 2a, when the address input signal is at a low level it is extremely difficult to design the capacitor 51 to have an optimum value sufficient to render the transistor fully conductive. When the capacitance of the capacitor 51 is made sufficiently large to make the gate voltage of the transistor 39 high, the speed of rendering the transistor 39 conductive becomes low when the address input signal is at a high level. Even when the optimum capacitance value for the capacitor 51 is selected, since such a capacitance is voltage dependent, as the source voltage $V_{DD}$ varies within a permissible range, the capacitance value would deviate from the optimum value.

SUMMARY OF THE INVENTION

It is an object of this invention to provide an improved buffer circuit having a high sensitivity and a high operating speed and which consumes less power.

Briefly stated the invention is characterized in that it comprises an address signal input which is supplied with an input through the gate electrode of an MOS transistor, a capacitor for compensating for a potential drop of the output of a flip-flop circuit, a bootstrap circuit for producing an MOS level signal and a transfer gate circuit coupled between the output of the flip-flop circuit and an address signal output circuit for outputting an address signal.

According to this invention there is provided a buffer circuit comprising a flip-flop circuit including a first MOS transistor having source and gate electrodes, and a drain electrode coupled to a first input/output terminal, and a second MOS transistor having a drain electrode coupled to the gate electrode of the first MOS transistor and a second input/output terminal, a source electrode coupled to the source electrode of the first MOS transistor, and a gate electrode coupled to the first input/output terminal; a discharge circuit connected between the commonly connected source electrodes of the first and second MOS transistors of the flip-flop circuit, and a first fixed source potential for discharging said source electrodes when a first start signal or a second start signal is inputted; first and second capacitors for respectively AC coupling the first and second start signals to the first and second input/output terminals of the flip-flop circuit; a first transfer gate circuit for executing a NOR logic function between a TTL level address input signal and a reset signal; a second transfer gate circuit for executing a NOR gate logic function between the reset signal and a reference signal applied to a reference potential terminal; a third transfer gate circuit coupled between an output terminal of the first transfer gate circuit and the first input/output terminal of the flip-flop circuit for selectively transmitting an output signal of the first transfer gate circuit to the first input/output terminal in accordance with the potential of the second input/output terminal of the flip-flop circuit and the first start signal, a fourth transfer gate circuit coupled between an output terminal of the second transfer gate circuit and the second input/output terminal for selectively transmitting an output of the second transfer gate circuit to the second input/output terminal in accordance with the potential of the first input/output terminal of the flip-flop circuit and the first start signal; the first to fourth transfer gate circuits, the discharge circuit, the first and second capacitors, and the flip-flop circuit constituting a sensing and amplifying circuit; a fifth transfer gate circuit coupled between a first MOS level address signal output terminal and the first fixed source potential for executing a NOR logic function between a potential of a third input terminal and the reset signal; a sixth transfer gate circuit coupled between a second MOS level address signal output terminal and the first fixed source potential for executing a NOR logic function between the potential of a fourth input terminal and the reset signal; a first bootstrap circuit for selectively raising the potential of the first MOS level address signal output terminal according to a to the fourth input terminal and a third start signal; a second bootstrap circuit for selectively raising the potential of the second MOS level address signal output terminal in accordance with a signal applied to the third input terminal and the third start signal; the first and second bootstrap circuits constituting an output transmission circuit; a seventh transfer gate circuit coupled between the third input terminal and said first input/output terminal of said flip-flop circuit and selectively enabled and disabled by the potential of the second input/output terminal of the flip-flop circuit; an eighth transfer gate circuit coupled between the fourth input terminal and the second input/output terminal of the flip-flop circuit and selectively enabled and disabled by the potential of the first input/output terminal of the flip-flop circuit; a first precharge circuit for charging the first and second input/output terminals of the flip-flop circuit by the reset signal; a second precharge circuit for charging the third and fourth input/output terminals by the reset signal; and a reference potential generator for applying a reference potential to the reference potential terminal of the second transfer gate circuit of the sensing and amplifying circuit.

BRIEF DESCRIPTION OF THE DRAWINGS

In the accompanying drawings:

FIG. 1b shows waveforms of signal for operating the address buffer circuit shown in FIG. 1a;

FIG. 2b shows waveforms of the signals for operating the address buffer circuit shown in FIG. 2a;

FIG. 3b shows signal waveforms useful to explain the operation of the address buffer circuit shown in FIG. 3a;

FIG. 4b shows waveforms of an input signal and a reference potential utilized in the address buffer circuit shown in FIG. 4a.

DESCRIPTION OF THE PREFERRED EMBODIMENTS

Figure 3A:
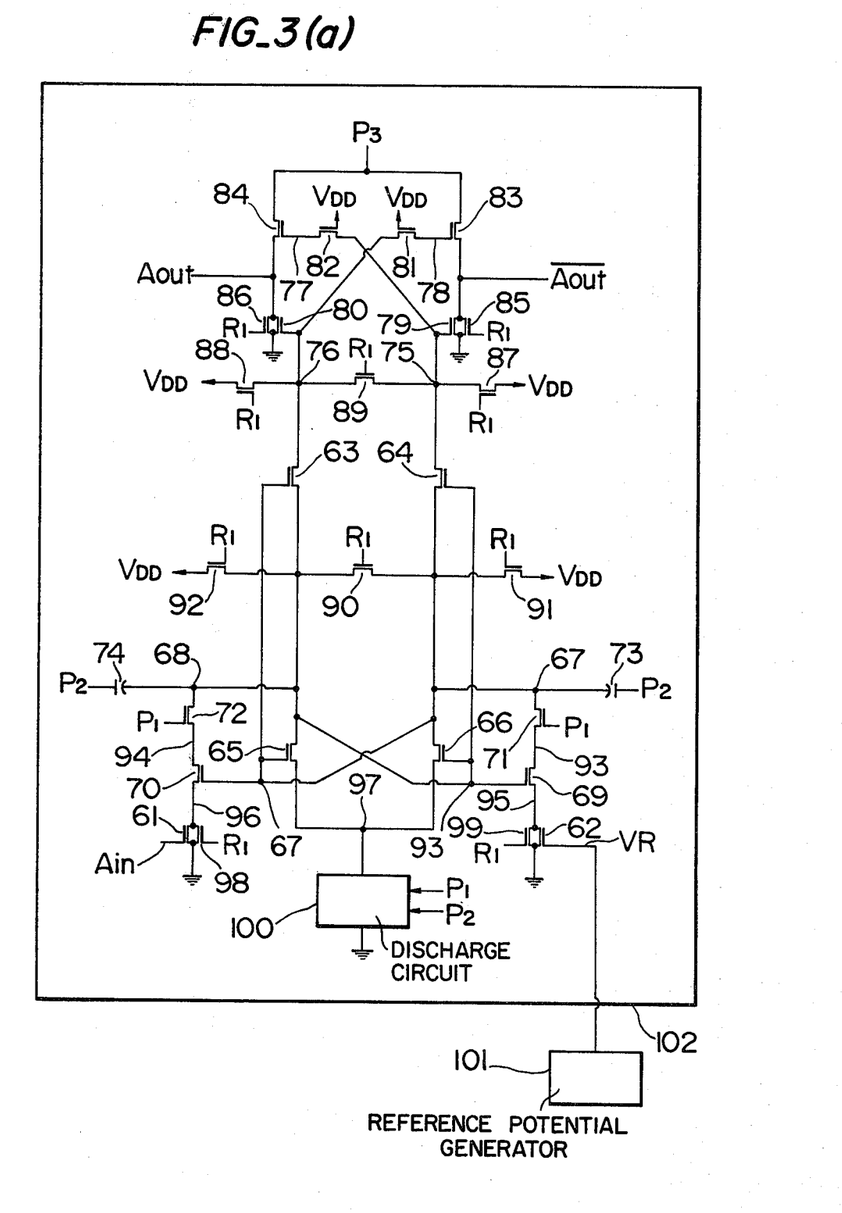
FIG. 3a is a connection diagram showing one embodiment of the address buffer circuit according to this invention.

A preferred embodiment of the invention illustrated in FIG. 3a comprises an address input terminal Ain adapted to receive a TTL address input signal and connected to the gate electrode of a transistor 61 having a grounded source electrode and having a drain electrode connected to a node 96 which is connected to the drain electrode of transistor 98 having its source electrode grounded. The gate electrode of the transistor 98 is connected to receive a reset signal $R_1$. The node 96 is also connected to the source electrode of a transistor 70 having its drain electrode connected to a node 94.

The node 94 is connected to the source electrode of a transistor 72 having its gate electrode connected to receive a signal $P_1$ (a first start signal); the drain electrode of transistor 72 is connected to a node 68 which is supplied with a signal $P_2$ (a second start signal) via an MOS capacitor (capacitance) 74.

The gate electrode of the transistor 70 is connected to a node 67, the gate electrode of a transistor 65, and the gate electrode of a transistor 63.

A reference potential generator 101 is provided to supply a reference potential $V_R$ to the gate electrode of a transistor 62 having its source electrode grounded and having its drain electrode connected to a node 95 which is connected to the drain electrode of a transistor 99 and to the source electrode of a transistor 69. The source electrode of the transistor 99 is grounded and the gate electrode thereof is supplied with a reset signal $R_1$.

The drain electrode of the transistor 69 is connected to a node 93 which, in turn, is connected to the source electrode of a transistor 71, the gate electrode thereof being supplied with the signal $P_1$; while the drain electrode of transistor 71 is connected to the node 67 which is supplied with the signal $P_2$ via an MOS capacitor (capacitance) 73.

The gate electrode of the transistor 69 is connected to the gate electrode of transistors 64 and 65, and to the drain electrode of transistor 65; the drain electrode of transistor 66 and the source electrode of the transistor 64 are connected to the node 67. The source electrode of transistors 65 and 66 are connected to the output terminal of a discharge circuit 100 via a node 97. Signals $P_1$ and $P_2$ are applied to the discharge circuit 100.

The drain electrode of the transistor 63 is connected to a node 76, and the drain electrode of the transistor 64 is connected to a node 75 which is connected to the source electrode of a transistor 87 and to the drain electrode of a transistor 89 and to the gate electrode of the transistor 79 and to the source electrode of a transistor 82.

In the same manner, a node 76 is connected to the source electrodes of transistors 88, 89 and 81 and to the gate electrode of a transistor 80. Respective gate electrodes of the transistors 87, 88 and 89 are supplied with a reset signal $R_1$, while the drain electrodes of transistors 87 and 88 are supplied with a fixed source voltage $V_{DD}$.

The source electrodes of the transistors 79 and 85 are grounded, and their drain electrodes are connected to the source electrode of a transistor 83 which produces an output $\overline{\text{Aout}}$ from its source electrode, and the reset signal $R_1$ is supplied to the gate electrode of the transistor 85.

In the same manner, the source electrodes of the transistors 80 and 86 are grounded, and the drain electrodes of these transistors are connected to the source electrode of the transistor 84, which produces an output Aout. The reset signal $R_1$ is applied to the gate electrode of the transistor 86.

The gate electrode of the transistor 83 is connected to a node 78 which is connected to the drain electrode of a transistor 81. The gate electrode of a transistor 84 is connected to a node 77 which is connected to the drain electrode of a transistor 82. The gate electrodes of transistors 81 and 82 are supplied with the fixed source voltage $V_{DD}$, and the drain electrodes of transistors 83 and 84 are supplied with a signal $P_3$.

The various transistors described above are all MOS transistors, and transistors 65 and 66 constitute a flip-flop circuit. Transistors 61 and 98 constitute a first transfer gate circuit for executing a NOR logic function, while transistors 62 and 99 constitute second transfer gate circuit for also executing a NOR logic function.

Transistors 70 and 72 constitute a third transfer gate circuit, while transistors 69 and 71 constitute a fourth transfer gate circuit. Transisltors 80 and 86 constitute a fifth transfer gate circuit, while transistors 79 and 85 constitute a sixth transfer gate circuit. These fifth and sixth transfer gate circuits are used to also execute a NOR logic function.

Furthermore, the transistor 63 constitutes a seventh transfer gate circuit and transistor 64 constitutes an eighth transfer gate circuit. Transistors 90, 91 and 92 constitute a first precharge circuit, while transistors 87, 88 and 89 constitute a second precharge circuit.

The MOS capacitor 74 acts as a first capacitance, while MOS capacitor 73 acts as a second capacitance. The node 68 acts as a first input/output terminal, while the node 67 acts as a second input/output terminal. The node 76 acts as a third input terminal, while the node 75 as a fourth input terminal.

Transistors 82 and 84 constitute a first bootstrap circuit, while transistors 81 and 83 constitute a second bootstrap circuit.

The first to fourth transfer gate circuits, the discharge circuit 100, the flip-flop circuit, and the first and second capacitors constitute a sensing amplifier circuit, while the fifth transfer gate circuit, the sixth transfer gate circuit, and the first and second bootstrap circuits constitute an output transfer circuit.

The output Aout is derived from a first MOS level signal output terminal, while the output $\overline{\text{Aout}}$ is derived from a second MOS level signal output terminal.

Figure 3B:
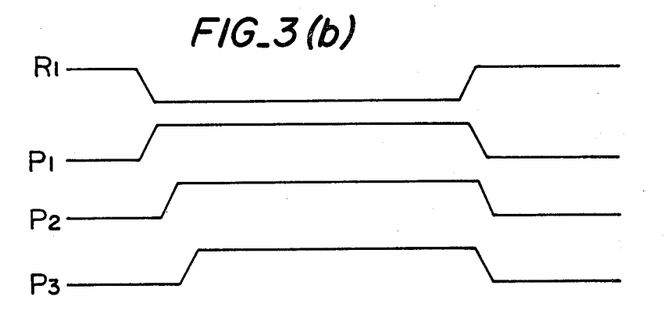

The buffer circuit shown in FIG. 3a operates as follows: the output voltage of the reference potential generator 101 is set to an intermediate or mean value of the high and low levels of a TTL signal and it is assumed now that a high level TTL input signal is applied to the address input terminal Ain. When the timing signals $R_1$, $P_1$, $P_2$ and $P_3$ shown in FIG. 3b are at H, L, L and L levels respectively, transistors 85, 86, 87, 88, 89, 90, 91, 92, 98 and 99 are turned ON so that output terminals Aout and $\overline{\text{Aout}}$, and nodes 95 and 96 are at a ground potential. Consequently, the potentials of the nodes 67, 68, 75 and 76 are all equal to $V_{DD}-V_{Tc}$ and capacitors 73 and 74 are charged to this voltage, where $V_{Tc}$ represents the threshold voltage of transistors 87, 88, 91 and 92.

Then, transistors 65, 66, 69 and 70 become conductive, and the nodes 93 and 34 assume a ground potential and since low level timing signals $P_1$ and $P_2$ are applied to the discharge circuit 100, the potential of the node 97 becomes equal to $V_{DD}-V_{Tc}-V_{Td}$, where $V_{Td}$ represents the threshold voltage of transistors 65 and 66.

Transistors 81 and 82 also become conductive and these transistors become nonconductive when the voltages at the nodes 77 and 78 become equal to $V_{DD}-V_{Tc}$.

Then, when the levels of the timing signals $R_1$, $P_1$, $P_2$ and $P_3$ are successively changed to L, H, H and H levels respectively, the node 97 assures a ground potential and transistors 71 and 72 become conductive.

At this time, the potentials of the nodes 67 and 68 decrease, but since the potential drop of the node 68 is larger than that of the node 67, the potentials of the nodes 67 and 68 are latched so as to be H and L levels respectively.

The node 68 is coupled to the gate electrode of the transistor 69 to turn OFF the same so that immediately after the flip-flop circuit constituted by transistors 65 and 66 has been brought to the latch state, a change of the level of the address signal from an H level to an L level does not effect the logic state of the node 67.

For the purpose of preventing a temporary drop of the voltage of the node 67 when a high level timing signal $P_1$ is inputted, a high level timing signal $P_2$ is applied through a capacitor 73 so as to compensate for this voltage drop. This prevents a temporary decrease in the source potential of transistor 64 causing a temporary conduction thereof, thereby enabling the node 75 to maintain the voltage ($V_{DD}-V_{Tc}$) prevailing at the time of precharge.

When a low level signal is applied to the address signal input Ain, the capacitor 74 operates in the same manner as above described.

When the node 67 or 68, 75 or 76 and 77 or 78 becomes a low level, depending upon the condition of the address input, the capacitors 73 and 74 are effective to rapidly discharge the potentials of these nodes.

Since the node 77 has a potential of $(V_{DD}-V_{Tc})$ transistor 84 becomes conductive and a high level signal appears at the output terminal Aout. At this time, since transistor 82 is nonconductive, due to the bootstrap effect of the gate-source and gate-drain parasitic capacitances of the transistor 84, the potential at the output terminal rapidly builds up to the fixed source voltage $V_{DD}$.

When the timing signal $P_1$ becomes a high level, transistor 81 becomes conductive to reduce the potential of the node 78 to a ground potential, whereby transistor 83 becomes nonconductive and a low level (ground potential) output signal is produced at the output terminal $\overline{\text{Aout}}$ since transistor 79 is conductive.

When a low level TTL input signal is applied to the address input terminal Ain, the buffer circuit operates according to the same principle.

Figure 3C:
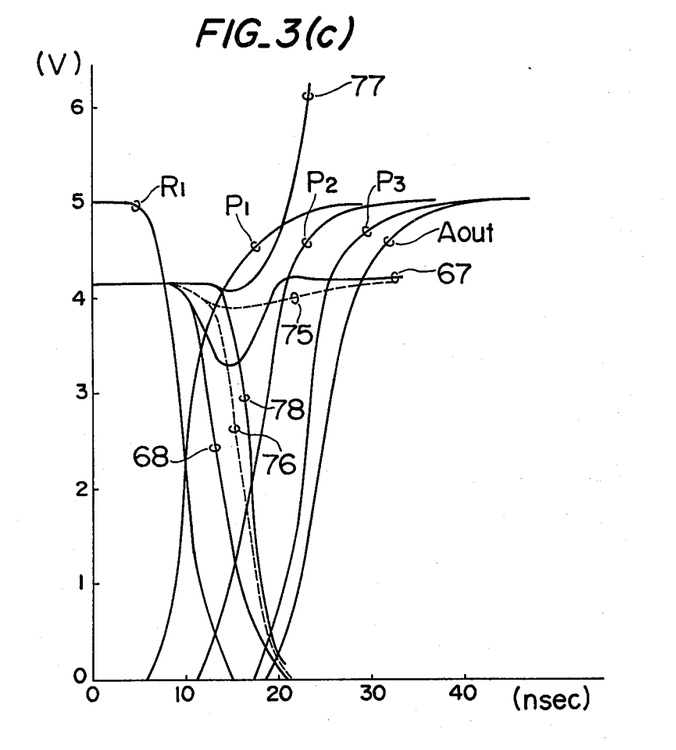
FIG. 3c shows waveforms of the essential points of the address buffer circuit shown in FIG. 3a and obtained by a computer simulation.

FIG. 3c is a graph showing variations with time of the potentials of various nodes of the buffer circuit shown in FIG. 3a, these waveforms being obtained by simulating the circuit with an electronic computer, in which reference characters applied to various curves correspond to those shown in FIG. 3a. FIG. 3c clearly shows that voltage drop at the node 67 does not greatly effect the voltage drop of the node 75.

The invention described above has the following advantages. The capacitors 73 and 74 prevent the potential drop of the low level output of the flip-flop circuit after the timing signal $P_1$ has built up and the latching speed of the flip-flop circuit is increased by shortening the discharge time of the output side at the low level.

Furthermore, a bootstrap circuit constituted by transistors 82, 84, 81 and 83 is effective to raise the potential of the output terminal Aout or $\overline{\text{Aout}}$ to the fixed source voltage $V_{DD}$ so that the building up time of the signal is reduced, thus enabling a high speed operation of the output circuit.

Immediately after application of the timing signal $P_1$ by the transistors 69 and 70, even when the address input signal varies, since the flip-flop circuit positively latches, the holding time of the address input signal can be shortened.

Due to the conduction of the transistors 79 and 80, the output at the output terminal Aout or $\overline{\text{Aout}}$ is at the low level, so that the output is made to become equal to a ground potential, thus avoiding the floating state.

Since the signal level does not decrease during the application of the address input signal to the gate electrode of the transistor, the set up time of the address signal can be reduced.

Figure 4A:
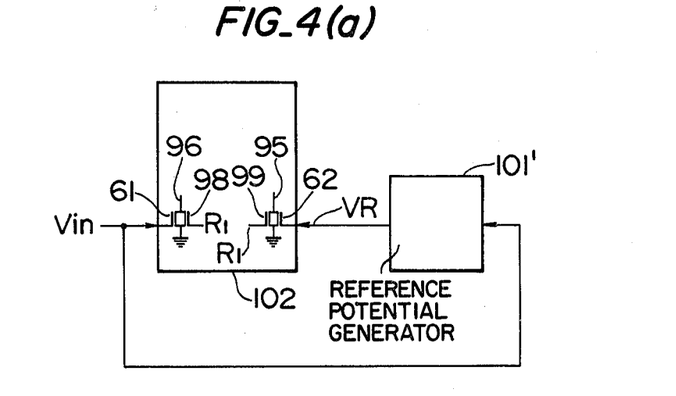
FIG. 4a is a block diagram showing a modified embodiment of this invention.
Figure 4B:
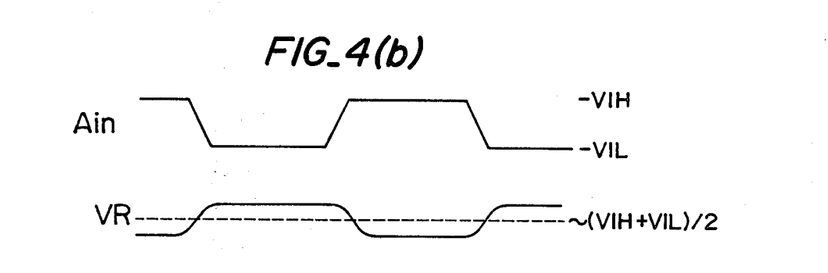

FIG. 4a shows another embodiment of this invention in which reference numeral 102 designates the buffer circuit shown in FIG. 3a and 101' represents a reference potential generator controlled by the address input signal. The reference potential generator 101' is input with the address input signal Ain as shown in FIG. 4b and produces a reference signal $V_R$ having a phase which is opposite to that of the address input signal and an amplitude of (VIH+VIL)/2 where VIH is a high level voltage of the address signal and VIL is a low level voltage of the address signal.

According to this modification, as the potential difference between the outputs of the flip-flop circuit is increased, the sensitivity thereof is increased with the result that the operating speed is higher than that of the first embodiment.

What is claimed is:

1. A buffer circuit comprising:

a flip-flop circuit including a first MOS transistor having source and gate electrodes, and a drain electrode coupled to a first input/output terminal, and a second MOS transistor having a drain electrode coupled to said gate electrode of said first MOS transistor and a second input/output terminal and having a source electrode coupled to said source electrode of said first MOS transistor and having a gate electrode coupled to said first input/output terminal;

a discharge circuit connected between the commonly connected source electrodes of said first and second MOS transistors of said flip-flop circuit and a first fixed source potential for discharging said source electrodes when a first start signal or a second start signal is inputted;

first and second capacitors for respectively AC coupling said first and second start signals to said first and second input/output terminals of said flip-flop circuit;

a first transfer gate circuit for executing a NOR logic function between a TTL level address input signal and a reset signal;

a second transfer gate circuit for executing a NOR gate logic function between said reset signal and a reference signal applied to a reference potential terminal;

a third transfer gate circuit coupled between an output terminal of said first transfer gate circuit and said first input/output terminal of said flip-flop circuit for selectively transmitting an output signal of said first transfer gate circuit to said first input/output terminal in accordance with a potential at said second input/output terminal of said flip-flop circuit and a first start signal;

a fourth transfer gate circuit coupled between an output terminal of said second transfer gate circuit and said second input/output terminal for selectively transmitting an output of said second transfer gate circuit to said second input/output terminal in accordance with a potential at said first input/output terminal of said flip-flop circuit and said first start signal;

said first to fourth transfer gate circuits, said discharge circuit, said first and second capacitors and said flip-flop circuit constituting a sensing and amplifying circuit;

a fifth transfer gate circuit coupled between a first MOS level address signal output terminal and said first fixed source potential for executing a NOR logic function between a potential at a third input terminal and said reset signal;

a sixth transfer gate circuit coupled between a second MOS level address signal output terminal and said first fixed source potential for executing a NOR logic function between a potential at a fourth input terminal and said reset signal;

a first bootstrap circuit for selectively raising a potential at said first MOS level address signal output terminal according to a signal applied to said fourth input terminal and a third start signal;

a second bootstrap circuit for selectively raising a potential at said second MOS level address signal output terminal in accordance with a signal applied to said third input terminal and said third start signal;

said first and second bootstrap circuits constituting an output transmission circuit;

a seventh transfer gate circuit coupled between said third input terminal and said first input/output terminal of said flip-flop circuit and selectively enabled and disabled by a potential at said second input/output terminal of said flip-flop circuit;

an eighth transfer gate circuit coupled between said fourth input terminal and said second input/output terminal of said flip-flop circuit and selectively enabled and disabled by a potential at said first input/output terminal of said flip-flop circuit;

a first precharge circuit for charging said first and second input/output terminals of said flip-flop circuit by said reset signal;

a second precharge circuit for charging said third and fourth input/output terminals by said reset signal; and a reference potential generator for applying a reference potential to said reference potential terminal of said second transfer gate circuit of said sensing and amplifying circuit.

2. A buffer circuit according to claim 1, wherein each of said first and second transfer gate circuits comprises a pair of MOS transistors of the same conductivity type.

3. A buffer circuit according to claim 1, wherein each of said third and fourth transfer gate circuits comprises a set of serially connected MOS transistors of the same conductivity type.

4. A buffer circuit according to claim 1, wherein each of said seventh and eighth transfer gate circuits comprises a single MOS transistor.

5. A buffer gate circuit according to claim 1, wherein each of said fifth and sixth transfer gate circuits comprises a pair of MOS transistors of the same conductivity type.

6. A buffer circuit according to claim 1, wherein the output potential of said reference potential generator is equal to a mean value of the high and low levels of said TTL level address input signal.

7. A buffer circuit according to claim 1, wherein the output potential of said reference potential generator in an opposite phase relationship with respect to said TTL level address input signal and increases and decreases about a potential which is substantially equal to a mean value of said TTL level address input signal.

8. A buffer circuit according to claim 1, wherein said first bootstrap circuit comprises a third MOS transistor having a gate electrode, a drain electrode which is supplied with said second start signal, and a source electrode which coupled to said first MOS level signal output terminal and further comprises a fourth MOS transistor having a drain electrode which is coupled to said gate electrode of said third MOS transistor, a source electrode which is coupled to said fourth input terminal, and a gate electrode which is connected to a second fixed source potential; and wherein said second bootstrap circuit comprises a fifth MOS gate transistor having a gate electrode, a source electrode which is coupled to said second MOS level output terminal, and a drain electrode which is supplied with said second start signal and further comprises a sixth MOS transistor having a gate electrode which is supplied with said second fixed source potential, a drain electrode which is coupled to said gate electrode or said fifth MOS transistor, and a source electrode which is coupled to said third input terminal.

* * * * *